(12) United States Patent
Quek (10) Patent No.: US 10,411,684 B2
(45) Date of Patent: *Sep. 10, 2019

(54) HIGH-SPEED PHASE INTERPOLATOR (71) Applicant: INPHI CORPORATION, Santa Clara, CA (US)

(72) Inventor: Irene Quek, Singapore (SG)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/153,248

(22) Filed: Oct. 5, 2018

(65) Prior Publication Data
US 2019/0052253 A1    Feb. 14, 2019

Related U.S. Application Data

(63) Continuation of application No. 15/343,608, filed on Nov. 4, 2016, now Pat. No. 10,128,827.

(51) Int. Cl.
| H03K 5/13 | (2014.01) |
| H03K 5/135 | (2006.01) |
| H03M 1/86 | (2006.01) |
| H03K 5/00 | (2006.01) |
| H04L 27/38 | (2006.01) |

(52) U.S. Cl.
CPC ............. *H03K 5/135* (2013.01); *H03M 1/86* (2013.01); *H03K 2005/00052* (2013.01); *H04L 27/38* (2013.01)

(58) Field of Classification Search
CPC .................... H03K 5/135; H03K 5/13; H03K 2005/00052; H03K 2005/00286; H03B 27/00; H03H 11/18; H03H 11/20; H03H 11/22; G06F 1/04; G06F 1/08; G06F 1/10; H03M 1/86; H04L 27/38
See application file for complete search history.

(56) References Cited

U.S. PATENT DOCUMENTS

| 10,128,827 B1* | 11/2018 | Quek | H03K 5/135 |
| 2015/0070065 A1* | 3/2015 | Dedic | H03H 17/08 |
| | | | 327/254 |

* cited by examiner

*Primary Examiner* — Long Nguyen
(74) *Attorney, Agent, or Firm* — Richard T. Ogawa; Ogawa P.C.

(57) ABSTRACT

The present invention relates generally to integrated circuits. More particularly, the present invention provides a circuit and method for a CMOS interpolator for an output clock signal with a desirable phase for a high speed serializer/deserializer device. In a specific embodiment, the present invention provides a phase interpolator device that mixes phase-shifted clock signals according to a predetermined weight values at predetermined time intervals. There are other embodiments as well.

20 Claims, 7 Drawing Sheets

HIGH-SPEED PHASE INTERPOLATOR

CROSS-REFERENCES TO RELATED APPLICATIONS

The present application is a continuation of U.S. patent application Ser. No. 15/343,608, filed Nov. 4, 2016, the entire contents of which is incorporated herein by reference.

STATEMENT AS TO RIGHTS TO INVENTIONS MADE UNDER FEDERALLY SPONSORED RESEARCH AND DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention relates generally to integrated circuits. More particularly, the present invention provides a circuit and method for a CMOS interpolator for an output clock signal with a desirable phase for a high speed serializer/deserializer device. But it will be recognized that the technique can be used for regulating memory devices (e.g., DDR 4 SDRAM devices, DDR4 register devices, DDR4 controller devices), and other high speed data applications.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily.

With high demand for communication networks came high demand for quality networking devices. One of the critical components of network devices is phase interpolator. For example, a phase interpolator is often used as a critical circuit in the receiver of the serial link that allows the receiver to adjust the phase of its sampling clocks in fine increments. Over the past, various types of phase interpolators have been proposed and implemented. For example, conventional phase interpolators include voltage controlled interpolators and current controlled interpolators. Among other things, conventional phase interpolators are usually complex and require large amount of power to operate.

Therefore, it is desirable to have new and improved phase interpolators.

BRIEF SUMMARY OF THE INVENTION

The present invention relates generally to integrated circuits. More particularly, the present invention interpolator devices for an output clock signal with a desirable phase for a high speed serializer/deserializer device. In a specific embodiment, the present invention provides a phase interpolator device that mixes phase-shifted clock signals according to a predetermined weight values at predetermined time intervals. There are other embodiments as well.

According to an embodiment, the present invention provides a phase interpolator device. The device includes a clock buffer for receiving input clock signals and providing buffered clock signals and a bias signal. The input clock signals includes a first clock signal and a second clock signal. The first clock signal and the clock signal are separated by a predetermined phase. The buffered clock signals include a first buffered clock signal and a second buffered clock signal. The device also includes a bias generator being configured to generate a control signal. The device further includes a digital-analog-converter (DAC) module comprising a plurality of DAC blocks and being configured to generate an intermediate clock signal. The four DAC blocks include a first DAC block and a second DAC block. The first DAC block is configured to process the first buffered clock signal and contribute to the intermediate clock signal at a first time interval at a first predetermined weight. The second DAC block is configured to process the second buffered clock signal and contribute to the intermediate clock signal at a second time interval at a second predetermined weight. The device also includes a clock generator that is configured to process the intermediate clock signal to generate an output clock signal. The first and second DAC blocks are configured to operate in a mixing mode until a predetermined trip point is reached.

According to another embodiment, the present invention provides a phase interpolator device. The device includes an interface for receiving four clock signals, which include a first clock signal and a second clock signal. The first clock signal and the second clock signal are separated by a 90-degree phase. The device also includes a bias generator that is configured to generate a control signal, which is associated with a clock period of the four clock signals. The device further includes a digital-analog-converter (DAC) module comprising a plurality of DAC blocks and being configured to generate an intermediate clock signal. The four DAC blocks include a first DAC block and a second DAC block. The first DAC block is configured to process a first clock signal and contribute to the intermediate clock signal at a first time interval at a first predetermined weight. The second DAC block being configured to process the second clock signal and contribute to the intermediate clock signal at a second time interval at a second predetermined weight. The first and second DAC block are configured to operate in a mixing mode until a predetermined trip point is reached. The first and second DAC comprise a reset block for generating a reset signal to stop the mixing mode.

According to yet another embodiment, the present invention provides a phase interpolator device. The device includes an interface for receiving four clock signals, which include a first clock signal and a second clock signal. The first clock signal and the second clock signal are separated by a 90-degree phase. The device further includes a bias generator that is configured to generate a control signal, which is associated with a clock period of the four clock signals. The device additionally includes a digital-analog-converter (DAC) module comprising a plurality of DAC blocks and being configured to generate an intermediate clock signal. The four DAC blocks include a first DAC block and a second DAC block. The first DAC block is configured to process a first clock signal and contribute to the intermediate clock signal at a first time interval at a first predetermined weight. The second DAC block is configured to process the second clock signal and contribute to the intermediate clock signal at a second time interval at a second predetermined weight. The first and second DAC block are configured to operate in a mixing mode until a predetermined trip point is reached. The first DAC block and the second DAC block apply the control current as unit current during the mixing mode.

It is to be appreciated that embodiments of the present invention provide many advantages over conventional techniques. Among other things, by mixing input phase-shifted clock signals to generate additional phases and/or steps as needed reduces power consumption and circuit complexity of conventional phase interpolator devices (e.g., such as conventional current and voltage controlled phase interpolators). Additionally, embodiments of the present invention utilize one-directional linear ramping, which translates to additional headroom for the DAC blocks, improved linearity, and area saving from DAC components. Compared to existing phase interpolator implementations, embodiments of the present invention take advantage of bias generators that automatically calibrate unit current used by DAC blocks, thereby eliminating the need for external (i.e., external to phase interpolator devices) semiconductor wafer process monitoring circuitries or extra control bits to reduce process variation. This calibration process requires no external power supply voltage monitoring circuitries or extra control bits to trim off supply voltage sensitivities. The calibration process further provides the benefit of requiring no external temperature monitoring circuitries. Phase interpolator devices according to embodiments of the present invention further provide the benefit of tracking input clock frequency, and additional control logics are not required to track clock frequency changes. Furthermore, implementations of phase interpolator devices according to the present invention require no external bandgap circuitries to provide precision bandgap current or control bits, thereby simplifying device integration, reducing area costs, reducing power consumption, and simplifying testing processes.

Embodiments of the present invention can be implemented in conjunction with existing systems and processes. For example, phase interpolator devices according to embodiments of the present invention can be manufactured using existing manufacturing systems and equipment. In addition, phase interpolators devices according to the present invention can be implemented and utilized in existing and future systems, such receiver devices, SerDes systems, transceivers, and/or others.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates generally to integrated circuits. More particularly, the present invention interpolator devices for an output clock signal with a desirable phase for a high speed serializer/deserializer device. In a specific embodiment, the present invention provides a phase interpolator device that mixes phase-shifted clock signals according to a predetermined weight values at predetermined time intervals. There are other embodiments as well.

As explained above, phase interpolators are useful and important components of network devices. For example, phase interpolators provide fraction of clock phases to help receivers adjust phases. In an ideal system, a high performance phase interpolator would involve a large number of steps and thus a high level of granularity among available clock phases, thereby allowing receiver devices to perform phase adjustment as needed. At the same time, to offer a large number of steps between clock phases is expensive, both in complexity and power consumption. It is thus to be appreciated that embodiments of the present invention provide an energy efficient and cost effective technique to generate fractional phase adjustments.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1A:
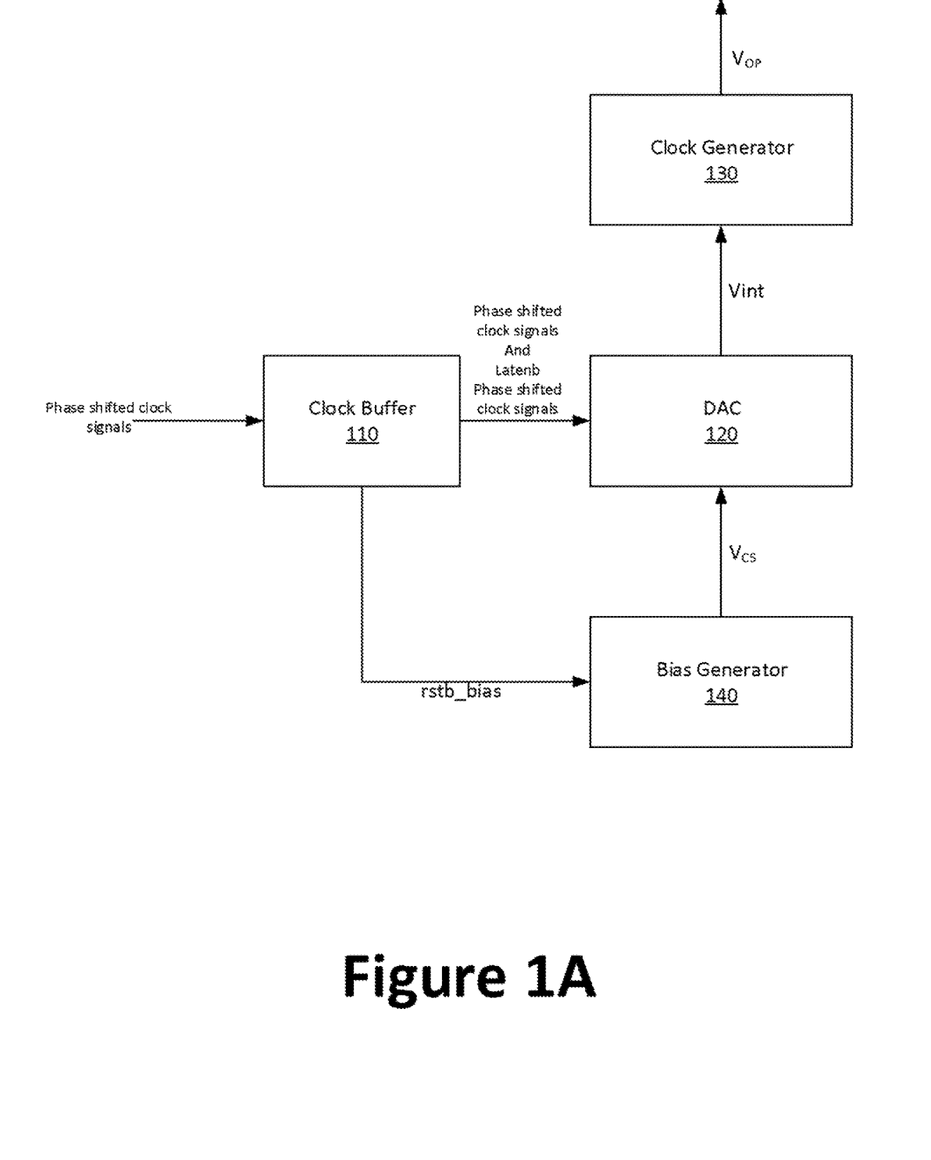
FIG. 1A is a simplified diagram of a phase interpolator device according to an embodiment of the present invention.

FIG. 1A is a simplified diagram of a phase interpolator device according to an embodiment of the present invention. This diagram is merely an example, which should not unduly limit the scope of the claims. One of ordinary skill in the art would recognize many variations, alternatives, and modifications. As shown in FIG. 1A, a phase interpolation device includes a clock buffer 110, a DAC module 120, a clock generator 130, and a bias generator 140. Among other things, clock buffer 110 provides control for rise and fall time of clock edges for the received input clock signals. As an example, the phase interpolator device in FIG. 1A is implemented as a part of a communication system. In various embodiments, phase interpolators devices according to embodiments of the present invention are implemented as components of receiver systems, which be used for clock-data recovery (CDR), clock adjustment, data sampling, and/or other applications. This allows for the clock signals to be fanned out with more stability and less jitter. For example, clock buffer 110 receives phase shifted clock signals and make corrections. In various embodiments, inputs to clock buffer 110 includes phase shifted clock signals from clock source. In a specific embodiment where four phase shifted clock signals are used (e.g., 90 degrees apart), inputs to clock buffer 110 include four phase shifted clock signals: clock phase 0 or "ph0", clock phase 90 or "ph90", clock phase 180 or "ph180", and clock phase 270 or "ph270". Additionally, inputs may also include corresponding selector signals for the phase shifted clock signals (e.g., sel0, sel90, sel180, and sel270), which provide control functions. The outputs of clock buffer 110 includes phase shifted clock signals (e.g., "ph0", "ph90", "ph180", "ph270") and latenb phase shifted clock signals (e.g., "latenb0", latenb90", "latenb180", "latenb"270"). For example, latency associated with latenb phase shifted clock signals may be attributed to transmission delay and/or delay associated with clock buffer 110. In various embodiments, clock buffer 110 also provides a reset bias signal "rstb_bias", which is used by bias generator 140.

As shown in FIG. 1A, DAC module 120 is coupled to clock buffer 110. Depending on the implementation, DAC module 120 may include a number of individual DAC blocks. DAC module 120 also includes control logic to coordinate and control operation of the DAC blocks. For example, DAC module 120 uses the phase shifted clock signals receive from clock buffer 110 to generate an intermediate output $V_{INT}$, which is used by clock generator 130 to provide an output signal $V_{op}$ as shown. Additionally, DAC module 120 includes control logic for operating in mixing mode for generating additional clock phases (or steps between input clock phases) as needed. When operating in mixing mode for generating the output $V_{INT}$ signal, DAC module 120 also uses the $V_{CS}$ signal from bias generator 140. The $V_{CS}$ signal functions as unit current that DAC module 120 uses when ramping its voltage in mixing mode.

As an example, operation of bias generator 140 is illustrated in further detail in FIG. 5 and described below.

DAC module 120 uses a predetermined number of DAC blocks to generate desired fractional clock phases using phase shifted clock signal received from clock buffer 110. Depending on the specific implementation, DAC module 120 may include four or more DAC blocks, and each of the DAC block correspond to an input phase-shifted clock signal (e.g., for four input phase shifted clock signals, 0 degree, 90 degrees, 180 degrees, and 270 degrees).

Figure 1B:
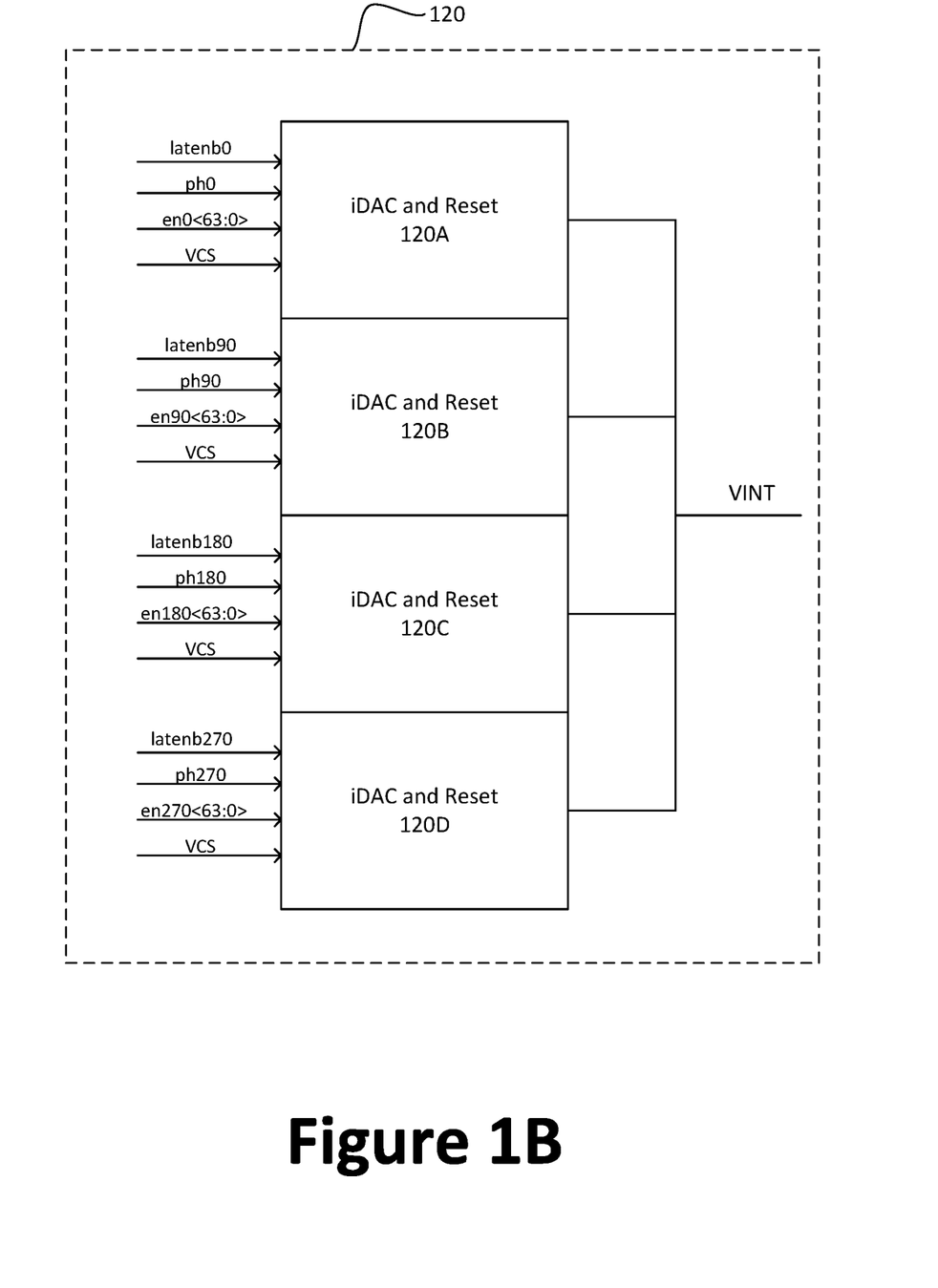
FIG. 1B is a simplified diagram illustrating a DAC module according to an embodiment of the present invention.

FIG. 1B is a simplified diagram illustrating a DAC module according to an embodiment of the present invention. This diagram is merely an example, which should not unduly limit the scope of the claims. One of ordinary skill in the art would recognize many variations, alternatives, and modifications. As shown in FIG. 1B, DAC module 120 includes for DAC blocks: 120A, 120B, 120C, and 120D. More specifically, DAC block 120A is configured to process 0 degree phase-shifted clock signal; DAC block 120B is configured to process 90 degrees phase-shifted clock signal; DAC block 120C is configured to process 180 degrees phase-shifted clock signal; and DAC block 120D is configured to process 270 degrees phase-shifted clock signal. Each of the DAC block receives a pair of clock signals (phase shifted clock signal and a latenb phase shifted clock signal) from the clock buffer, a digital input, and the bias signal $V_{CS}$. For example, DAC block 120A processes 0 degree phase shifted clock signal. Inputs for DAC block 120A include 0 degree latenb phase shifted clock signal and 0 degree clock signal, both of which are received from the clock buffer (e.g., clock buffer 110). The bias current $V_{CS}$ input of DAC block 120A comes from the bias generator. For example, the same bias generator 140 may be utilized to provide bias current for all of the DAC blocks (i.e., 120A-D). The digital inputs for the DAC blocks provide weight values assigned to corresponding DAC blocks when operating in mixing mode. For example, input "en0<63:0>" for DAC block 120A indicates the weight assigned to 0 degree phase shifted clock. In various embodiments, DAC module 120 includes a memory (not shown) that stores predetermined weight values associated with different phase shifted clock signals, the predetermined weight values are provided to the corresponding DAC blocks (e.g., 6-bit value in an exemplary implementation). The DAC module 120 additionally includes control logic (not shown in FIG. 1B) that indicate the weight values at different time. Additionally, depending on the desired fractional output clock phases (e.g., level of granularity between incoming phase shifted clock signals), the control logic at the DAC module 120 would coordinate the weight values provided to the DAC blocks. For example, DAC module 120 may store multiple tables corresponding to different phase clock output settings.

Output of the DAC blocks are added together to generate the intermediate output signal $V_{INT}$. For example, in a four DAC block configuration, clock signals are quarter duty cycle (or 90 degrees) separated from one another. With "on" and "off" both at half duty cycle (or 180 degrees), at any given time, two of the four phase shifted clock signals are at "on", and the other two of the four phase shifted clock signals are at "off". Depending on the weight values assigned to the clock signals and their corresponding DAC blocks, the output the of two DAC blocks that are "on" are combined to generate an intermediate output $V_{INT}$ at mixing mode operation. As an example, operation of DAC module 120 is illustrated in FIG. 2.

Figure 2:
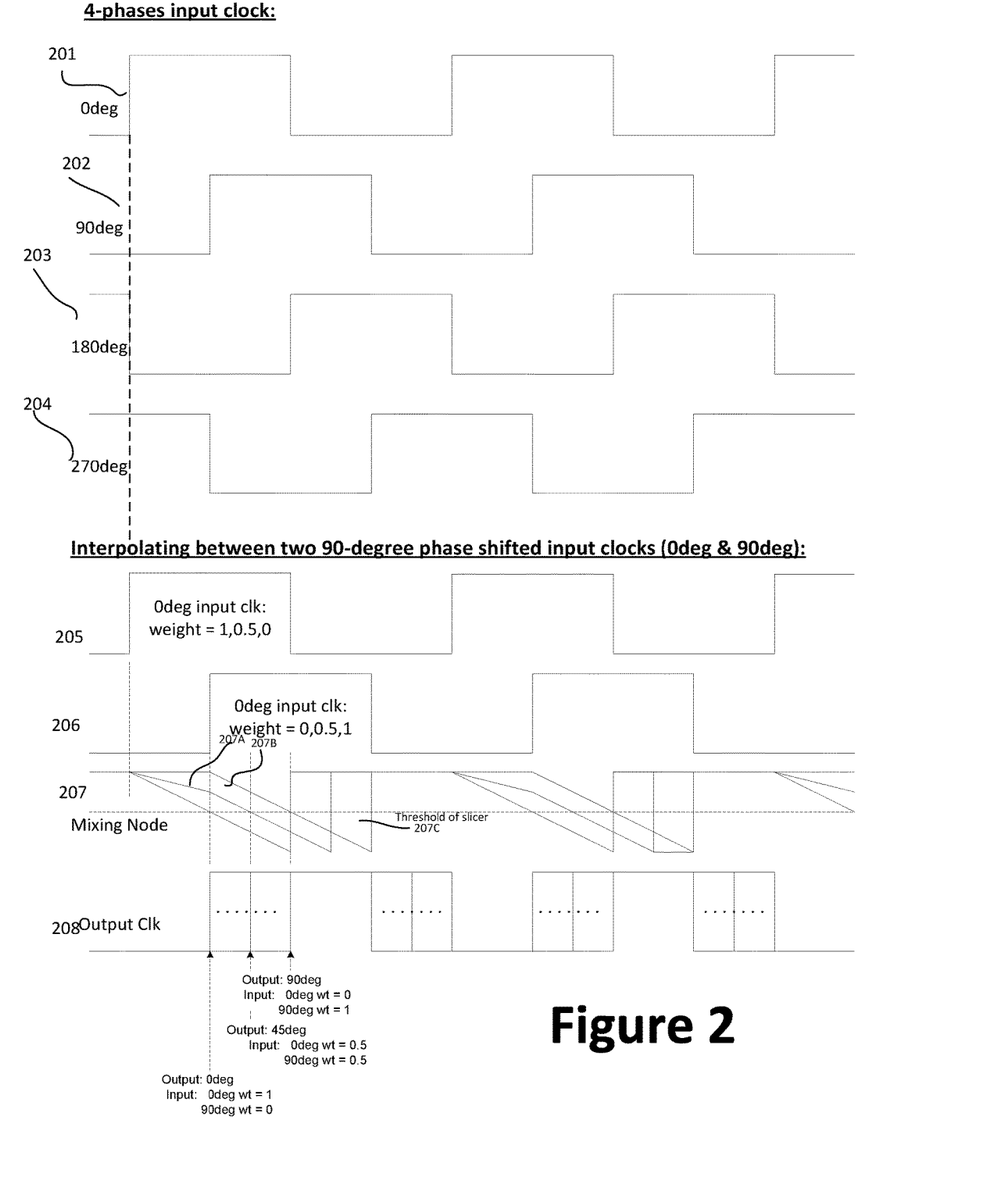
FIG. 2 is a simplified timing diagram illustrating operation of a phase interpolator according to an embodiment of the present invention.

FIG. 2 is a simplified timing diagram illustrating operation of a phase interpolator according to an embodiment of the present invention. This diagram is merely an example, which should not unduly limit the scope of the claims. One of ordinary skill in the art would recognize many variations, alternatives, and modifications. As shown in FIG. 2, an input clock provides four phases, which are shown as waveforms 201, 202, 203, and 204. More specifically, the four waveforms are phase shifted and separated by 90-degrees. Each of the waveforms are characterized by a 50% duty cycle, i.e., "on" for half of the time. For example, waveform 201 corresponds to 0 degree; waveform 202 corresponds to 90 degrees phase shift; waveform 203 corresponds to 180 degrees phase shift; and waveform 204 corresponds to 270 degrees phase shift. With four input clock phases, full 360-degrees phase interpolation can be obtained. For example, the input clock signal may be received from a clock module and processed by a clock buffer (e.g., clock buffer 110 in FIG. 1). To obtain additional fractional clock phases, two phase-shifted input clock signals are used as two input signals. For example, the DAC module 120 assigns weights respectively to the two input signals and mixes (e.g., adding) the two weighted input signals. By varying the weights assigned to the two input signals, an interpolated phase within the 90 degrees boundary (e.g., phase separation between the two input signals) can be obtained. As illustrated in FIG. 1B, the DAC module 120 comprises four DAC blocks 120A-120B. Each of the DAC blocks, with their respective input phase-shifted clock signals, independently switches on and off. For example, each of the DAC blocks may contribute current in the mixing mode, or simply output phase-shifted clock signals.

In various embodiments, weight values of each DAC block during mix mode are provided by DAC module 120. In a specific embodiment, specific weights for each of the DAC blocks in the mixing mode are stored at DAC module 120. For example, specific weight values are associated with desired output phase that are to be obtained by mixing two or more phase-shifted clock signals. The lower portion of FIG. 2 illustrates mixing two 90-degrees phase-shifted clock signals (e.g., 0 degrees and 90 degrees). For example, waveform 205 is associated with 0-degrees clock signal, and waveform 206 is associated with 90-degrees clock signal. By mixing waveform 205 and waveform 206, the output clock signal as illustrated by waveform 208 can be obtained. The mixing process is illustrated by waveform 207 illustrating ramping up of voltages at different time. For example, with a weight value "1" assigned to 0-degree clock, waveform 207A shows that ramping up (or down) starts at 0 degrees, when the 0-degree clock is on. Waveform 207A ramps at the same rate until the time phase is at 180 degrees, when the 0-degree clock is off after its duty cycle is finished. For example, as waveform 207A ramps from the VDDA voltage at the mixing mode, the DAC module integrates the current on a capacitor until trip point is reached, which is at 180-degrees time.

For waveform 207B, 0-degree clock signal 205 and the 90 degree clock signal 206 are each assigned a weight of 0.5. At the 0 degree time, waveform 207B starts ramping when 0 degree clock 205 is on, but the ramping rate is lower than waveform 207A, since 0-degrees clock only contributes 0.5 (weight assigned for waveform 207B) of the current. At 90-degree time, the 90-degree clock signal 206 switches from low to high as shown, and the 0-degree clock signal 205 is still on, and as a result the ramp rate for waveform 207B increases at 90-degree time. It is to be noted since the 0-degree clock and the 90-degree clock each contributes a weight of 0.5, the total ramp rate at 90-degree time is increased to "1".

For waveform 207C, the 0-degree clock signal 205 is assigned a weight of 0, and thus waveform 207C only starts ramping up when the 90-degree clock is switched on at 90-degrees time.

It is to be understood that the specific weight combinations for phase-shifted clock signals are predefined for the purpose of generating additional phase-shift clock signals. For example, by using 0.5 weights and combining clock signals that are separated by 90 degrees, clock signals with 45-degrees separation can be obtained. In certain embodiments, different weights can be used to obtain different phase separations. For example, by using 0.25 weights and a predefined weight combination, output clock signals with 22.5-degrees separation can be obtained. As can be seen in FIG. 2, combined weight of two phase-shifted clock signals does not exceed "1". For example, for each of the waveforms 207A, 207B, and 207C, the combined weight of 0-degree clock signal and the 90-degrees clock signal is always 1. In various embodiment, the total weights assigned to the phase clock signals at any given time never exceeds "1". For example, weight values and their corresponding timing can be predetermined and stored by the DAC module. In certain embodiments, DAC modules and/or other components of the integrator device include algorithm that generate weight values (and other information such as timing) for the desired fractional clock phase output.

The resulting output clock signal (i.e., waveform 208) is generated at the mixing mode. In a specific embodiment, output clock signal is characterized by a 50% duty cycle. For example, a signal that turns on at 45 degrees would stay on until 225 degrees.

The ramping of the phase clock signals at the mixing mode is terminated when their respective trip points are reached. In various embodiments, trip points implemented as components of DAC blocks. For example, each of the DAC blocks includes a reset module for, which senses the voltage ramping up during the mixing mode. As explained below, the "reset" signal is latched and holds the mixing node at VDDA voltage level (provided by positive voltage supply) until end of the active cycle (i.e., as indicated by the falling edge of the active clock). Depending on the specific implementation, the VSSA (provided by negative supply voltage) voltage level can also be used to implement the trip-point of the mixing mode operation, in which the voltage ramps up linearly with invert DAC blocks. Since the output clock is generated by mixing phase shifted input clock signals, a duty cycle correction circuit may be used to correct the output of the mixing mode signals to provide the output clock waveform with 50% duty cycle.

Figure 3:
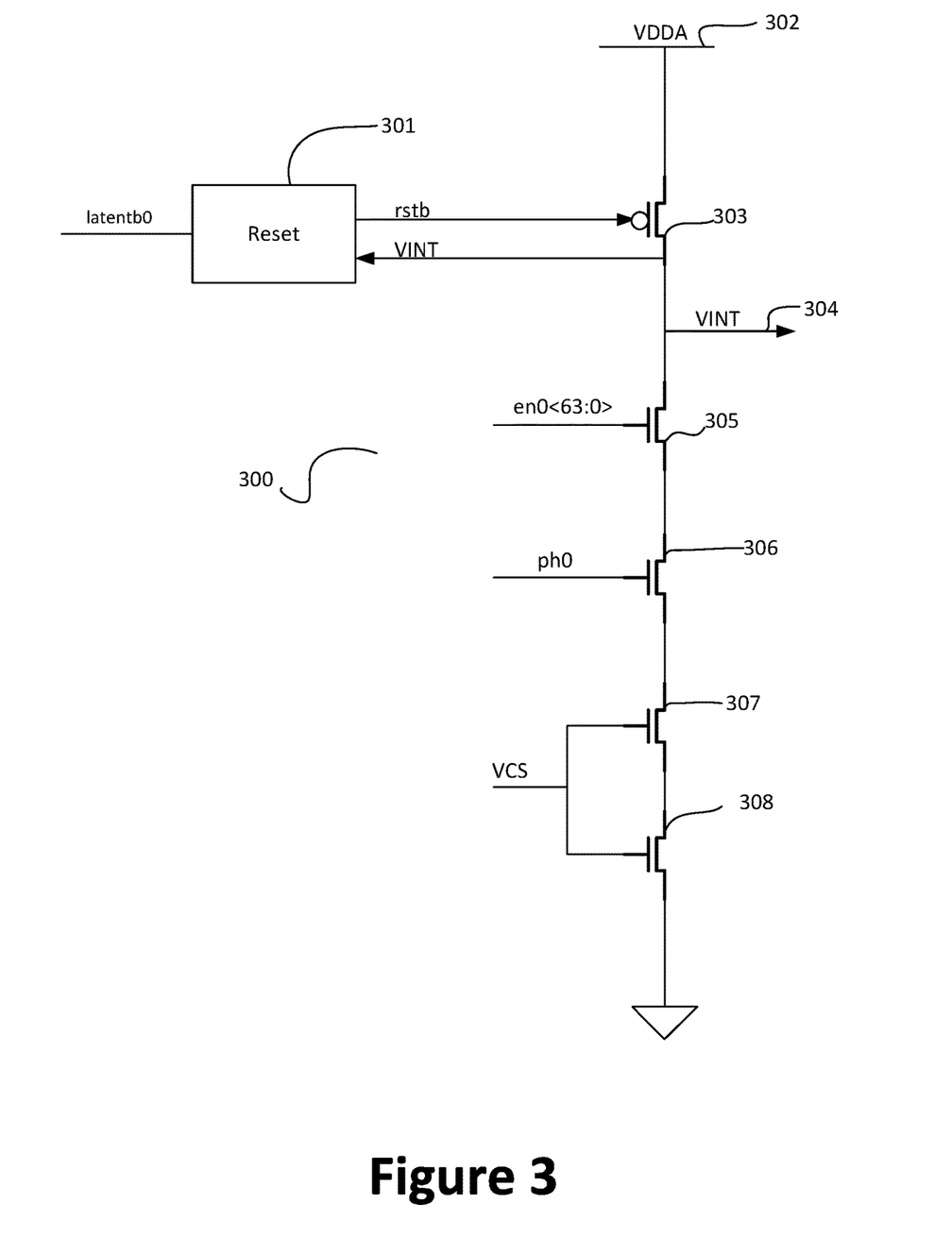
FIG. 3 is a simplified diagram illustrating a DAC block according to an embodiment of the present invention.
Figure 4:
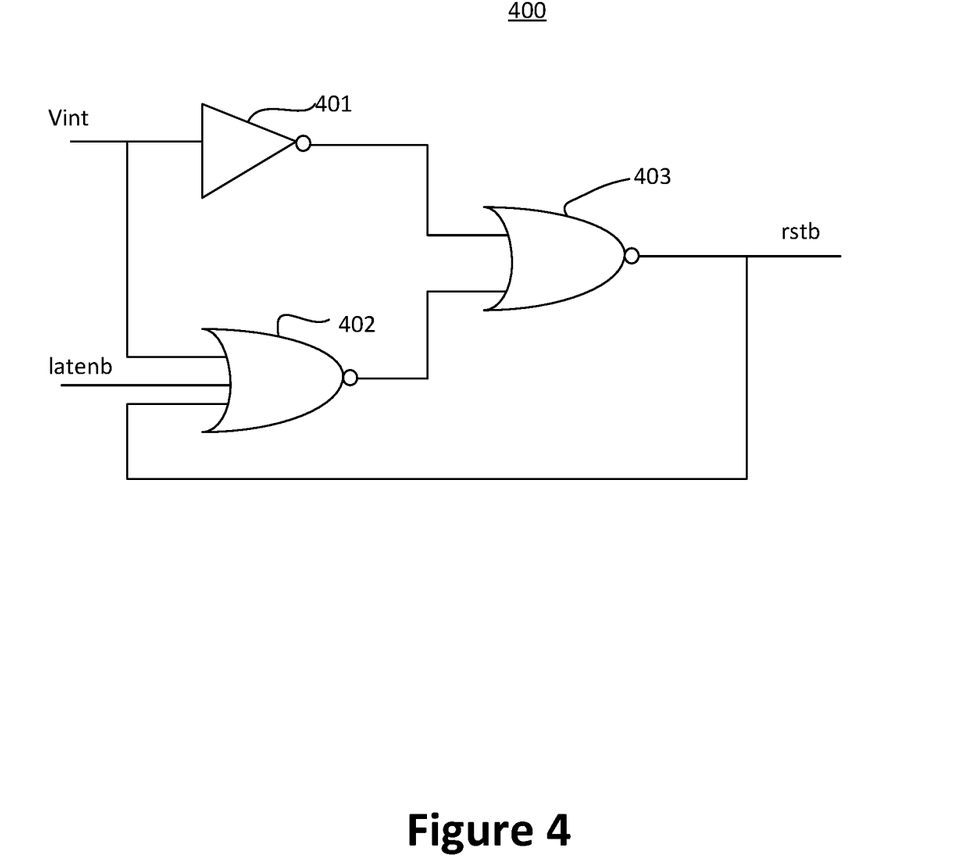
FIG. 4 is a simplified diagram illustrating a reset block according to an embodiment of the present invention.

FIG. 3 is a simplified diagram illustrating a DAC block according to an embodiment of the present invention. This diagram is merely an example, which should not unduly limit the scope of the claims. One of ordinary skill in the art would recognize many variations, alternatives, and modifications. As illustrated in FIG. 1B, a DAC module includes multiple DAC blocks, each being associated with a phase shifted input clock signal. For example, "latenb0" signal and "ph0" signal received by the DAC block 300 in FIG. 3 are used by DAC block 120A in FIG. 1B. DAC block 300 is coupled to voltage supply VDDA 302. The input signals include "latenb0" and "ph0", which are phase shifted clock signals corresponding to 0 degree input signal. Signal "latenb0" is used as an input for the reset block 301, which is illustrated in FIG. 4 and described below. A falling edge from signal "latenb0" would cause the reset block 301 to generate a result signal "rstb" that is coupled to the gate of switch 303. The drain terminal of the switch 303 is coupled to VDDA 302. The source terminal (e.g., output) of switch 303 is coupled to reset block 301 and intermediate output voltage $V_{INT}$ 304. When operating in mixing mode, voltage ramps down from the VDDA 302 until a predetermined trip-point is reached. For example, ramp rate is controlled by signal "en0<63:>", where ramp rate is associated with weight assigned to DAC 300 (e.g., 1, 0.5, 0.25, etc.). Additionally, input signal "$V_{CS}$" is coupled to gates of switch 307 and 308. Input signal $V_{CS}$ is generated by a bias generator module. For example, bias generator 140 is illustrated in FIG. 1A. Bias generator 140 uses "rstb_bias" signal from clock buffer 110 to generate $V_{CS}$ signal used by the DAC block 300. For example, the bias generator is a fraction replica of the actual current DAC used for phase interpolation. It is to be appreciated that fraction replica, compared to full replica, saves power. Using $V_{CS}$ signal to provide a unit current, DAC block 300 can apply weight value "en0<63:0>" to generate output $V_{INT}$ 304 during mixing mode.

As an example, bias generator mimics an actual phase-interpolator when its output phase is at 0 degree (i.e., full weight on phase 0 degree input clock and zero weight on phase 90 degree input clock. The $V_{CS}$ signal from the bias generator provides a unit current for the DAC block through a feedback loop. The trip-point of the mixing mode (e.g., sensed by the reset block 301) occurs at 90 degree phase shift (i.e., ¼ clock period) after the start of integration cycle. The duty cycle is 50%. The $V_{CS}$ signal from the bias generator thus provides calibration against semiconductor wafer processes, supply voltage variations, temperature variations, and input clock frequency, thereby ensuring the linearity of the phase interpolator system.

Depending on the implementation, the reset block 301 in FIG. 3 can be implemented in various ways. FIG. 4 is a simplified diagram illustrating a reset block according to an embodiment of the present invention. This diagram is merely an example, which should not unduly limit the scope of the claims. One of ordinary skill in the art would recognize many variations, alternatives, and modifications. For example, reset block 400 includes inverter 401, NOR 403 and NOR 402. Inverter 401 uses $V_{INT}$ signal as its input and provides an inverted output based on $V_{INT}$ signal. The NOR gate 402 uses "latenb" signal (e.g., latenb0 for 0 degree phase clock), $V_{INT}$ signal, and "rstb" signal as it inputs. The outputs of the inverter 401 and NOR gate 402 are used as inputs for NOR gate 403, which generates the "rstb" signal. As explained above, "rstb" signal is used as a reset signal for the mixing mode. The "rstb" signal is triggered when the intermediate output signal $V_{INT}$ reaches the trip point, which in turn causes the rest block 301 to generate the "rstb" signal that causes the mixing mode to reset. Signal "rstb" holds the reset of $V_{INT}$ until the rising edge of "latenb" signal.

Figure 5:
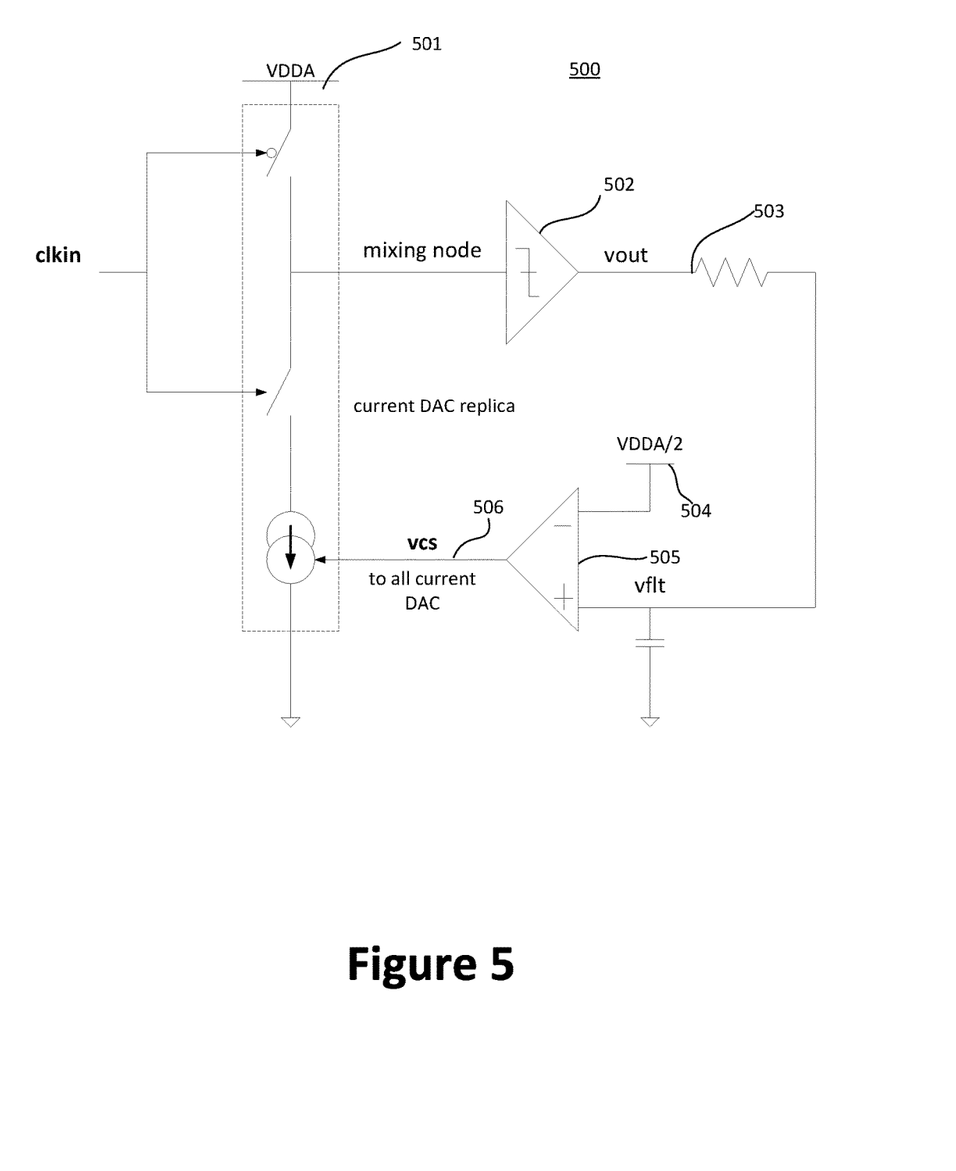
FIG. 5 is a simplified diagram illustrating a bias generator 500 according to an embodiment of the present invention.

FIG. 5 is a simplified diagram illustrating a bias generator 500 according to an embodiment of the present invention. This diagram is merely an example, which should not unduly limit the scope of the claims. One of ordinary skill in the art would recognize many variations, alternatives, and modifications. As explained above, a bias generator according to embodiments of the present invention provides signal $V_{CS}$ for the DAC blocks. As an example, clock signal "clkin" (e.g., based on the "rstb_bias" signal from clock buffer 110 shown in FIG. 1) is used as an input signal. Bias generator 500 uses both supply voltage 501 (VDDA) and half supply voltage 504 (VDDA/2) to generate bias current $V_{CS}$ 506 that is provided to all DAC blocks. For example, using "clkin" input from the phase shifted clock signals, bias generator 500 uses the rising edge of 0-degree phase shifted input clock signal to start its integration cycle, which last for the entire 75% duty cycle when the 0-degree clock signal is on high or when the 90-degree clock signal is on high. The mixing mode is reset to VDDA for a quarter clock period, and the reset is triggered by the falling edge of the 90-degrees phase clock signal. By using rising and falling edges of "clkin" signal, which is based the phase shifted clock signals, bias generator 500 sets unit current used by the DAC blocks, and its configuration provides calibration against device variability attributed to, among other things, semiconductor wafer processes, supply voltage variation, temperature and clock frequency variable, thereby ensures linearity of the phase interpolator device. Operation of bias generator 500, as an example, is illustrated in FIG. 6.

Figure 6:
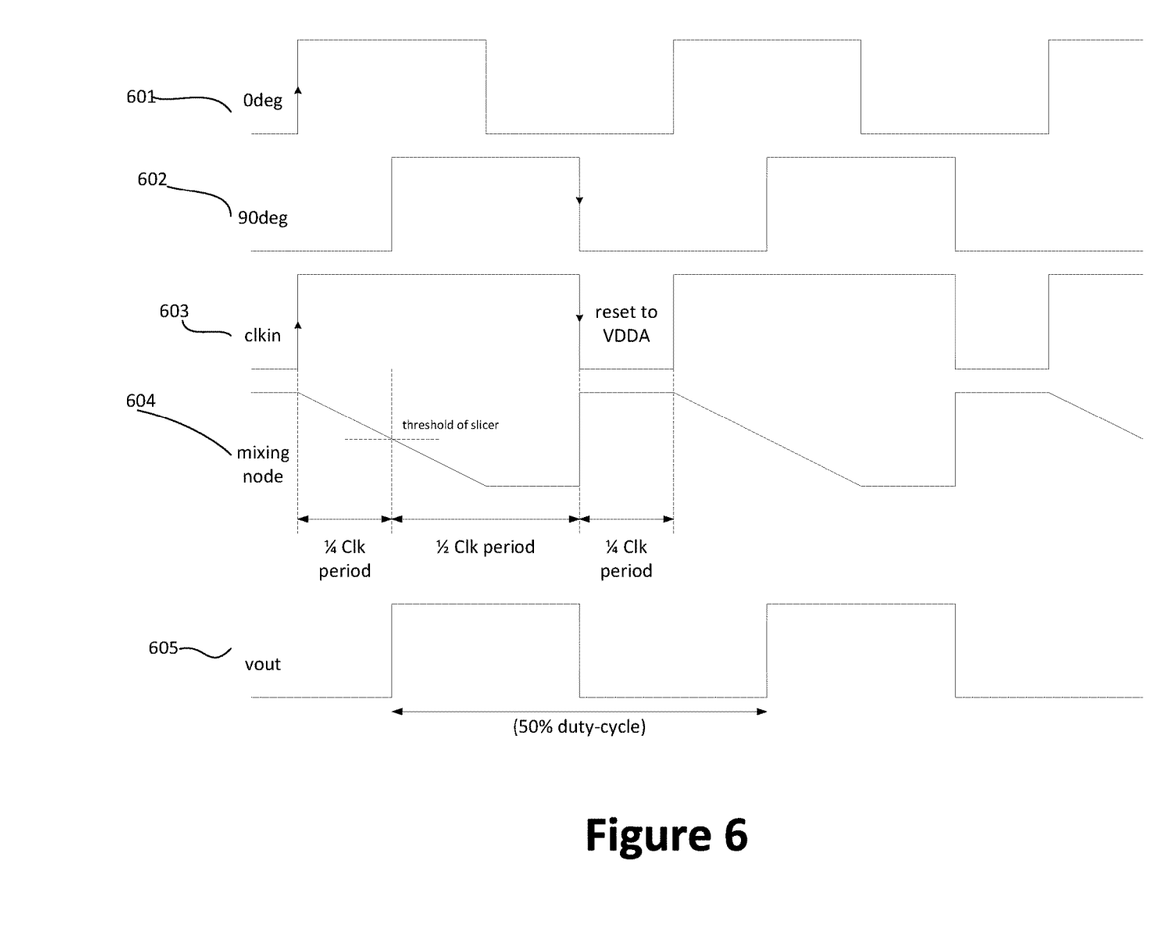
FIG. 6 is a simplified timing diagram illustrating operation of a bias generator as implemented in an phase interpolator according to an embodiment of the present invention.

FIG. 6 is a simplified timing diagram illustrating operation of a bias generator as implemented in an phase interpolator according to an embodiment of the present invention. This diagram is merely an example, which should not unduly limit the scope of the claims. One of ordinary skill in the art would recognize many variations, alternatives, and modifications. As shown in FIG. 6, the "clkin" signal 603 is based both 0-degree phase shifted clock signal 601 and 90-degrees phase shifted clock signal 602. The rising edges of 0-degree phase shifted clock signal 601 and falling edges of the 90-degrees phase shifted clock respectively define the rising and falling edges of "clkin" signal 603. More specifically, "clkin" signal 603 is switched to "on" upon rising edge of signal 601, and it stays "on" even after signal 601 switches off (e.g., after half clock cycle). The "clkin" signal 603 is switched to "off" up the falling edge of signal 602, when it resets to "VDDA" voltage, as explained above. Essentially, the "clkin" signal 603 stays "on" for three quarter of the clock period, and is only off for a quarter of clock period between the falling edge of signal 602 and rising edge of signal 601. Waveform 604 illustrates integration cycle of the bias generator, and it corresponds to the "clkin" signal 603. Integration of bias generator is triggered at the rising edge of the "clkin" signal 603 and/or ridge edges signal 601, and the mixing mode is reset to "VDDA" voltage for a quarter of the clock period, triggered by falling edges of "clkin" signal 603 and/or falling edges of signal 602. The period of integration cycle of the bias generator is based on the input clock period, and therefore the bias generator tracks the input clock frequency and automatically calibrates (e.g., through clock triggered resets) unit current that is used by the DAC.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. A phase interpolator device comprising:
   a clock buffer for receiving input clock signals and providing buffered clock signals, the input clock signals including a first clock signal and a second clock signal, the first clock signal and the second clock signal being separated by a predetermined phase, the buffered clock signals including a first buffered clock signal and a second buffered clock signal,
   a digital-analog-converter (DAC) module comprising DAC blocks and being configured to generate an intermediate clock signal, the DAC blocks including a first DAC block and a second DAC block, the first DAC block being configured to process the first buffered clock signal and contribute to the intermediate clock signal at a first time interval at a first predetermined weight, the second DAC block being configured to process the second buffered clock signal and contribute to the intermediate clock signal at a second time interval at a second predetermined weight, the first time interval partially overlapping the second time interval; and a clock generator configured to generate an output clock signal using at least the intermediate clock signal;

wherein the first DAC block is configured to operate in a mixing mode until a predetermined trip point is reached.

2. The device of claim 1 wherein:
the buffered clock signals further comprising a third buffered clock signal and a fourth buffered clock signal;
the DAC module further comprising a third DAC block and a fourth DAC block, the third DAC block being configured to process the third buffered clock signal and contribute to the intermediate clock signal at a third time interval at a third predetermined weight.

3. The device of claim 1 first comprising a bias generator configured to generate a control signal, the control signal being associated with a duration of the first time interval.

4. The device of claim 1 wherein the two or fewer buffered clock signals are active at the same time.

5. The device of claim 1 wherein the first weight is stored as a 6-bit value.

6. The device of claim 1 wherein the first DAC block further comprises a capacitor to integrate current from the bias signal when operating in the mixing mode.

7. The device of claim 1 wherein the first DAC block is coupled to a supply voltage, the first DAC block being configured to ramp from the supply voltage until the trip point is reached.

8. The device of claim 7 wherein the supply voltage is a positive supply voltage (VDDA) or a negative supply voltage (VSSA).

9. The device of claim 7 wherein the first DAC block is characterized by a ramp rate based on the first weight.

10. The device of claim 1 wherein the output clock signal is characterized by a 50% duty cycle.

11. The device of claim 1 wherein the first buffered clock signal and the second buffered clock signal are separated by a 90 degrees phase shift.

12. The device of claim 1 wherein the bias signal is associated with a clock period of the input clock signal.

13. The device of claim 1 wherein the first DAC block uses the control signal from the bias generator as a unit current.

14. A communication system comprising
a phase interpolator device that comprises:
an interface for receiving four clock signals, the four clock signals including a first clock signal and a second clock signal, the first clock signal and the second clock signal being separated by a 90-degree phase; and a digital-analog-converter (DAC) module comprising DAC blocks and being configured to generate an intermediate clock signal, the DAC blocks including a first DAC block and a second DAC block, the first DAC block being configured to process the first clock signal and contribute to the intermediate clock signal at a first time interval at a first predetermined weight, the second DAC block being configured to process the second clock signal and contribute to the intermediate clock signal at a second time interval at a second predetermined weight, the first time interval partially overlapping the second time interval;

wherein:
the first DAC block is configured to operate in a mixing mode until a predetermined trip point is reached;
the first DAC block comprises a reset block for generating a reset signal to stop the mixing mode.

15. The system of claim 14 wherein the reset block generates the reset signal based at least on the intermediate clock signal.

16. A method for generating fractional phase signals, the method comprising:
receiving four clock signals, the four clock signals including a first clock signal and a second clock signal, the first clock signal and the second clock signal being separated by a 90-degree phase;
generating a control signal, the control signal being associated with a clock period of the four clock signals;
assigning a first weight value to the first clock signal;
assigning a second weight value to the second clock signal;
accumulating an intermediate signal using a unit current based on the first weight value and the first clock signal during a first time interval during a mixing mode;
accumulating the intermediate signal using the unit current based on the second weight value and the second clock signal during a second time interval during a mixing mode;
generating a reset signal to terminate the mixing mode; and
generating an output clock signal based on the intermediate signal.

17. The method of claim 16 further comprising:
receiving a first digital value associated with the first weight value;
converting the first digital value to the first weight value using a DAC.

18. The method of claim 16 wherein the first time interval is initiated by a rising edge of first clock signal and terminated by a mixing mode trip point.

19. The method of claim 16 further comprising generating the unit current through a feedback loop.

20. The method of claim 16 wherein the first time interval and the second time interval partially overlap.

* * * * *